US 7,548,821 B2

(12) United States Patent
Tae et al.

(10) Patent No.: US 7,548,821 B2
(45) Date of Patent: Jun. 16, 2009

(54) BATTERY MANAGEMENT SYSTEM AND DRIVING METHOD THEREOF

(75) Inventors: Yong-Jun Tae, Yongin-si (KR); Soo-Seok Choi, Yongin-si (KR); Young-Jo Lee, Yongin-si (KR); Han-Seok Yun, Yongin-si (KR); Se-Wook Seo, Yongin-si (KR); Gye-Jong Lim, Yongin-si (KR); Beom-Gyu Kim, Yongin-si (KR); Ho-Young Park, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/771,733

(22) Filed: Jun. 29, 2007

(65) Prior Publication Data
US 2008/0091362 A1    Apr. 17, 2008

(30) Foreign Application Priority Data
Oct. 16, 2006    (KR) ..................... 10-2006-0100472

(51) Int. Cl.
*G01R 31/36*    (2006.01)
(52) U.S. Cl. ..................................................... 702/63
(58) Field of Classification Search ................. 702/60, 702/61, 63–65; 320/116, 118, 119, 127, 320/132, 134, 136
See application file for complete search history.

(56) References Cited

U.S. PATENT DOCUMENTS 6,404,166 B1    6/2002    Puchianu .................... 320/116
2007/0139015 A1*    6/2007    Seo et al. ..................... 320/132
2007/0145948 A1*    6/2007    Lim et al. .................... 320/132
2007/0299620 A1*    12/2007    Yun et al. ...................... 702/63
2008/0036421 A1*    2/2008    Seo et al. ..................... 320/132
2008/0074082 A1*    3/2008    Tae et al. ..................... 320/136

FOREIGN PATENT DOCUMENTS

| JP | 06-295747 | 10/1994 |
| JP | 10-210666 | 8/1998 |
| JP | 2003-017138 | 1/2003 |
| JP | 2003-17138 | 1/2003 |
| JP | 2003-243044 | 8/2003 |
| JP | 2005-261130 | 9/2005 |
| KR | 10-0709260 | * 4/2007 |

OTHER PUBLICATIONS

English Abstract of Lim et al., KR 2007047453, May 7, 2007.*
English Abstract of Lim et al., KR 709260, Apr. 19, 2007.*
English Translation of KR 10-0709260, Apr. 2007.*

* cited by examiner

*Primary Examiner*—Michael P Nghiem
(74) *Attorney, Agent, or Firm*—Stein McEwen, LLP

(57) ABSTRACT

The present invention relates to a battery management system and method. In some embodiments the battery management system includes a sensing unit and a micro controller unit (MCU). The sensing unit measures the current, the voltage and the temperature of a battery. The MCU receives the voltages, the currents, and the temperatures, calculates an estimated cell voltage, by applying a pack voltage sensing error and the cell voltage deviation to the cell voltages, and calculates an estimated cell resistance, by adding a pack assembly resistance to an internal resistance of the cell, and calculates an pack output of the battery by using the estimated cell voltage and the estimated cell resistance.

20 Claims, 2 Drawing Sheets

BATTERY MANAGEMENT SYSTEM AND DRIVING METHOD THEREOF

CROSS-REFERENCE TO RELATED APPLICATION

This application claims the benefit of Korean Application No. 2006-100472 filed on Oct. 16, 2006, in the Korean Intellectual Property Office the disclosure of which is incorporated herein by reference.

BACKGROUND OF THE INVENTION

1. Field of the Invention

Aspects of present invention relate to a battery management system. More particularly, the present invention relates to a battery management system and driving method thereof that is used for a vehicle, or other device using an electrical energy.

2. Description of the Related Art

Vehicles using gasoline or diesel internal combustion engines as a main power source cause pollution such as air pollution Recently, in order to reduce pollution, intensive research has been conducted to develop electric vehicles and hybrid vehicles.

Electric vehicles use electric motors that are operated by electrical energy output from batteries. Electric vehicles use batteries in which a plurality of rechargeable battery cells are formed as one pack, as a main power source. Electric vehicles benefit the environment because they do not discharge air pollutants and they have a reduced noise level.

A hybrid vehicle is a cross between a vehicle using an internal combustion engine and an electric vehicle, and can use two or more power sources, for example, an internal combustion engine and a battery powered motor. Now, complex hybrid vehicles that use an internal combustion engine, or an electric motor, and a fuel cell have been developed. Fuel cells react hydrogen and oxygen to directly obtain electrical energy.

As mentioned above, in the vehicle using the electrical energy, the performance of the battery directly influences the performance of the vehicle. Therefore, the battery cell should have excellent performance, and should have a battery management system (hereinafter, referred to as BMS) that efficiently manages the charge and discharge of the battery cells by measuring the voltages of the respective battery cells, as well as the voltage and current of the entire battery.

A BMS can store experimental data concerning a cell, or a module of a battery calculated by an experiment, and can check the current state of a battery by comparing the currently measured state of the battery with experimental data. It takes a large amount of time to produce and develop a pack, and the chemical composition of the battery can change. It is, therefore, difficult to measure the experimental data of the pack after configuring the pack. Further, the pack output data calculated by multiplying the experimental data of an individual battery cell by the number of cells is inaccurate. Therefore, a more accurate modeling method of calculating pack output is required.

The above information disclosed in this Background section is only for enhancement of understanding of the background of the invention and therefore it may contain information that does not form the prior art that is already known in this country to a person of ordinary skill in the art.

SUMMARY OF THE INVENTION

Aspects of the present invention has been made in an effort to provide a battery management system and method having advantages of compensating for errors that occur when a battery pack is configured, in order to more accurately calculate the battery pack output.

According to various embodiments, a battery management system is provided that manages a battery including at least one pack comprising a plurality of battery cells (cells). The battery management system comprises a sensing unit that measures a voltage, a current, and a temperature of each of the cells, and a micro processing unit (MCU) that receives the voltage, the current, and the temperature of the cells. The MCU calculates an estimated cell voltage by applying a pack voltage sensing error, and a cell voltage deviation, to the cell voltages, and calculates an estimated cell resistance by adding a pack assembly resistance to an internal resistance of the cells. The MCU calculates a pack output of the battery by using the estimated cell voltage and the estimated cell resistance.

In some embodiments, the MCU calculates a first estimated cell voltage by adding a pack voltage sensing error and a cell voltage deviation when the battery is charged, to the cell voltage. The MCU calculates a charging cell current by using a voltage difference between a fully charged cell voltage and a first estimated cell voltage, and the estimated cell resistance. In this case, the MCU calculates the charging pack output by using the following formula:

$$P_c = \left[\frac{4.2 - (V_{cell} + V_{acc} + V_{cell\_var})}{R_{cell}} \times 1000 \times 4.2\right] \times \text{the number of cells}$$

Wherein Vcell is a cell voltage, Vacc is a pack voltage sensing error, Vcell_var is a cell voltage deviation, and Rcell is an estimated cell resistance. Further, the MCU calculates the difference between the cell voltage, the pack voltage sensing error, and the cell voltage deviation that are produced while discharging the battery, to set as a second estimated cell voltage. The MCU calculates the discharging cell current by using a voltage difference between the second estimated cell voltage, the fully charged cell voltage, and an estimated cell resistance. In this case, the MCU calculates the discharging pack output of the battery using the following formula:

$$P_d = \left[\frac{(V_{cell} - V_{acc} - V_{cell\_var}) - 2.8}{R_{cell}} \times 1000 \times 2.8\right] \times \text{the number of cells}$$

Wherein Vcell is a cell voltage, Vacc is a pack voltage sensing error, Vcell_var is a cell voltage deviation, and Rcell is an estimated cell resistance.

According to aspects of another embodiment of the present invention a method of a battery management for a system that manages a battery including at least one pack comprising a plurality of cells. The driving method comprises:

calculating an estimated cell voltage by adding a pack voltage sensing error, a cell voltage deviation, and a cell voltage;

calculating an estimated cell resistance by adding a pack assembly resistance to an internal resistance of the cell; and calculating a pack output by using a difference between a fully charged or fully discharged cell voltage and the estimated cell voltage, and using the estimated cell resistance.

In various embodiments, the method comprises calculating pack output for a charging battery pack. In this case, the calculating of the estimated cell voltage comprises calculating a first estimated cell voltage by adding a pack voltage sensing error, a cell voltage deviation when the battery is fully charged, and the cell voltage. Further, the calculating of the estimated cell resistance comprises calculating a charged cell current by calculating the difference between a fully charged cell voltage (4.2 in this example) and the first estimated cell voltage, the result of which is divided by the estimated cell resistance. The method can be restated using the following equation:

$$P_c = \left[\frac{4.2 - (V_{cell} + V_{acc} + V_{cell\_var})}{R_{cell}} \times 1000 \times 4.2\right] \times \text{the number of cells}$$

Wherein, Vcell is a cell voltage, Vacc is a pack voltage sensing error, Vcell_var is a cell voltage deviation, and Rcell is an estimated cell resistance.

In some embodiments, the method comprises calculating pack output for a discharging battery pack. In this case, the calculating of the estimated cell voltage comprises calculating a second estimated cell voltage corresponding to the cell voltage, minus the pack voltage sensing error, and the cell voltage deviation, that are produced at the time of discharging the battery, to set as a second estimated cell voltage. In this case, the calculating of the estimated cell resistance comprises calculating the discharged cell current by a voltage difference between the second estimated cell voltage and the fully charged cell voltage, divided by an estimated cell resistance. The method can be restated using the following equation:

$$P_d = \left[\frac{(V_{cell} - V_{acc} - V_{cell\_var}) - 2.8}{R_{cell}} \times 1000 \times 2.8\right] \times \text{the number of cells}$$

Wherein Vcell is a cell voltage, Vacc is a pack voltage sensing error, Vcell_var is a cell voltage deviation, and Rcell is an estimated cell resistance.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
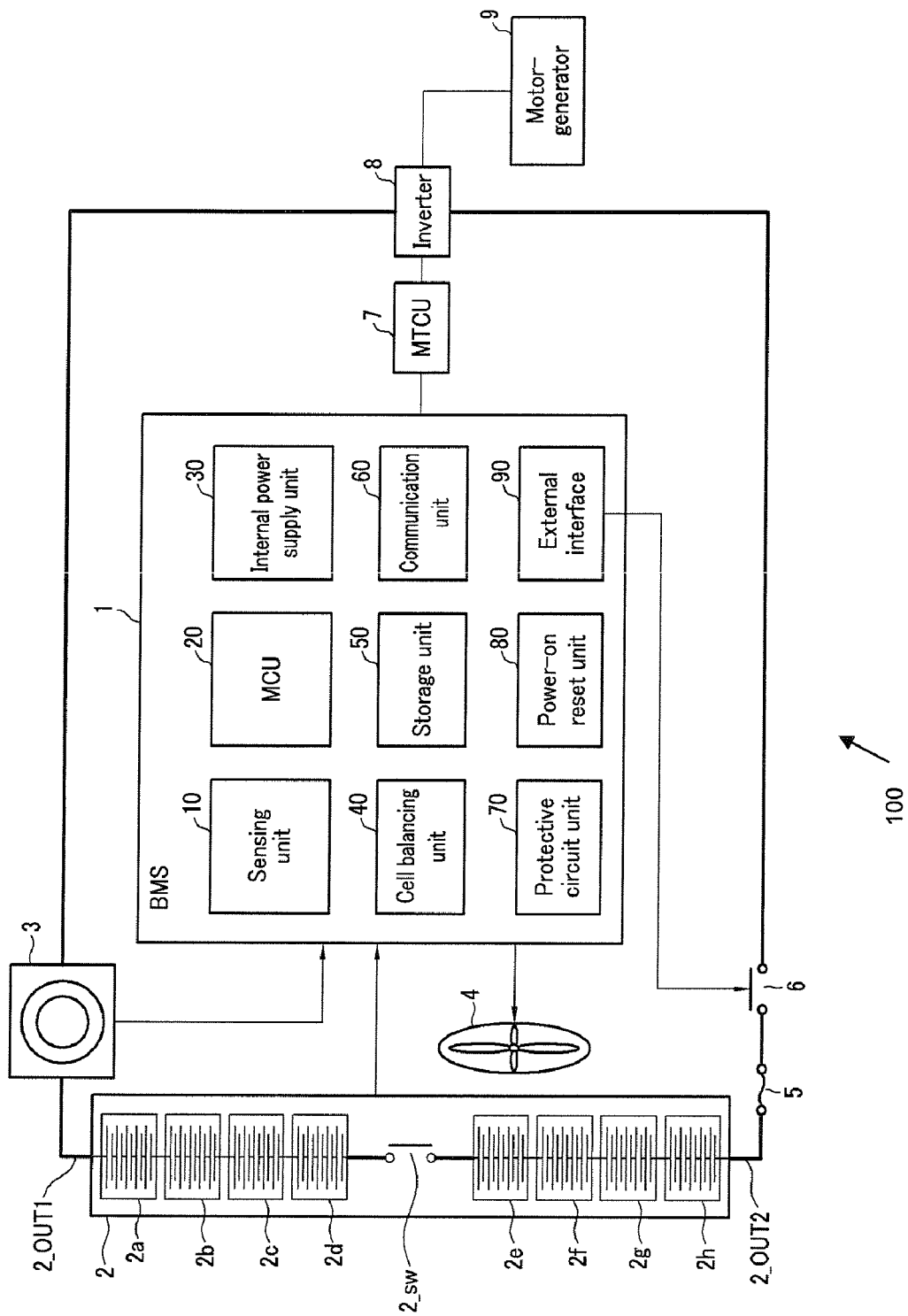
FIG. 1 is a schematic view illustrating a battery, a BMS, and a peripheral device of the BMS, according to an embodiment of the present invention.

Reference will now be made in detail to various embodiments of the present invention, examples of which are illustrated in the accompanying drawings, wherein like reference numerals refer to the like elements throughout. The embodiments are described below in order to explain aspects of the present invention by referring to the figures.

In this specification, when a part is connected to another part the part can be said to be directly connected to the other part. When a part is said to be electrically connected to another part the electrical connection can comprise a third element disposed between the parts. Further, when a part is said to include or comprise a constituent element, the portion does not exclude another constituent element, and can additionally include other elements.

According to various embodiments and as shown in FIG. 1, a battery management system 100 comprises a battery management controller (BMC) 1, a battery 2, a current sensor 3, a cooling fan 4, a fuse 5, a main switch 6, an MTCU (Motor Control Unit) 7, an inverter 8, and a motor-generator 9.

The battery 2 comprises: a plurality of sub packs 2a to 2h, in which a plurality of battery cells are coupled to each other in series; a first output terminal 2_OUT1; a second output terminal 2_OUT2; and a safety switch 2_SW disposed between the sub-pack 2d and the sub-pack 2e. In this embodiment, eight sub-packs 2a to 2h are exemplified, and each of the sub-packs comprises a plurality of battery cells in a group, but is not limited thereto. The safety switch 2_SW is disposed between the sub-pack 2d and the sub-pack 2e, but is not limited to this location. The safety switch 2_SW can be manually turned on and off for the operator's safety when the battery is replaced, or when performing a process on the battery. In various embodiments of the present invention, the safety switch 2_SW is disposed between the sub-pack 2d and the sub-pack 2e, but the present invention is not limited thereto. The first output terminal 2_OUT1 and the second output terminal 2_OUT2 are shown connected to the inverter 8.

The current sensor 3 measures the amount of current output from the battery 2, and outputs this information to the sensing unit 10. The current sensor 3 can be a Hall CT (Hall current transformer) that measures the current using a Hall element, and outputs an analog current signal corresponding to the measured current, or can be a shunt resistor that outputs a voltage signal with respect to a current value that flows through a resistor inserted in a load line.

The cooling fan 4 cools the heat that is generated due to the charging and discharging of the battery 2. The cooling fan can be operated on the basis of a control signal from the BMS 1. Temperature control can be important in order to prevent the deterioration of the battery 2 and the associated lowering of the charging and discharging efficiency.

The fuse 5 prevents an over-current, due to a broken wire or a short circuit of the battery 2, from being transmitted to the battery 2. For example, when an over current is generated, the fuse 5 is broken, to prevent the over current from being transmitted to the battery 2.

When an abnormal phenomenon such as over current, over voltage, or high temperature is generated, the main switch 6 turns on or off the battery 2 on the basis of a control signal from the BMC 1 or from the MTCU 7 of the vehicle.

In some embodiments, the BMC 1 comprises a sensing unit 10, an MCU (Micro Controller Unit) 20, an internal power supply unit 30, a cell balancing unit 40, a storage unit 50, a communication unit 60, a protective circuit unit 70, a power-on reset unit 80, and an external interface 90.

The sensing unit 10 measures the battery current, the battery voltage, and the battery temperature and transmits this information to the MCU 20.

The MCU 20 controls the charging and discharging of the battery by estimating a state of charging (hereinafter, referred to as SOC) and a state of health (hereinafter, referred to as SOH) of the battery 2, on the basis of cell voltage, cell current, cell temperature, battery current, battery voltage, and battery temperature information transferred from the sensing unit 10. Particularly, the MCU 20 calculates a pack output based on battery information, measured under various conditions, and errors produced when configuring the battery pack. The pack output, according to various embodiments, is calculated by applying a pack conversion error, to a voltage value and a current value, when the battery is charged or discharged. Hereinafter, the pack output that is calculated when the battery is charged is referred to as "charged pack output," and the pack output that is calculated when the battery is discharged is referred to as "discharged pack output." Further, the battery management system according to an embodiment, stores experimentally derived cell information, and information concerning constituent elements and connecting devices required when the cells are assembled into a pack.

Specifically, the MCU 20 receives a cell voltage Vcell from the sensing unit 10. The MCU 20 applies a pack voltage sensing error Vacc and a cell voltage deviation Vcell_var, to the cell voltage Vcell, to calculate an estimated cell voltage. The MCU 20 detects an internal resistance of the cells, and calculates an estimated cell resistance Rcell, by adding a pack assembly resistance to the detected internal resistance of the cells. In this case, the MCU 20 calculates a voltage difference between a fully charged voltage (4.2 V) or fully discharged voltage (2.8V) of the cell, and the estimated cell voltage. The MCU 20 calculates the charging or discharging pack current by using the calculated voltage difference and the estimated cell resistance Rcell. Then, the MCU 20 calculates the charging or discharging cell output, corresponding to the charging or discharging pack current, by using the pack current and calculates the charging or discharging cell output by using the calculated cell output.

The internal power supply unit 30 generally supplies power to the BMS 1 using a supplementary battery. The cell balancing unit 40 balances the charged states of the individual cells. That is, the cell balancing unit 40 discharges a cell that is relatively fully charged, and charges a cell that is insufficiently charged. The storage unit 50 stores data such as a current SOC, or SOH when the BMS 1 is powered off. The storage unit 50 may be an EEPROM, or any other suitable non-volatile storage device that is electrically writable and erasable. The communication unit 60 communicates with the MTCU 7 of a vehicle. The communication unit 60 transmits information concerning the SOC and the SOH from the BMS 1 to the MTCU 7, and receives information concerning the condition of the vehicle from the MTCU 7, that it can transmit to the MCU 20. The protective circuit unit 70 is a circuit that can be secondarily added to protect the battery 2 against an over current and/or an over voltage, using a hardware element. The protective circuit unit 70 performs a primary protecting operation by using firmware provided inside the MCU. The power-on reset unit 80 resets the entire system when the BMS 1 is turned on. The external interface 90 connects the supplementary devices of the BMS, such as the cooling fan 4, or the main switch 6, to the MCU 20. In this embodiment, only the cooling fan 4 and the main switch 6 are illustrated, but connectable supplementary devices are not limited thereto.

The MTCU 7 determines the current driving state of the vehicle, and determines the torque requirements thereof, on the basis of information of vehicle acceleration, braking, speed, etc. The current driving state of the vehicle refers to a key-on operation that starts an engine, a key-off operation that stops an engine, a driving operation, and an acceleration operation. The MTCU 7 transmits information concerning the state of the vehicle to the communication unit 60, of the BMS 1. The MTCU 7 controls the output of the motor-generator 9, in correspondence with the torque information. That is, the MTCU 7 controls the switching of the inverter 8, to control the output of the motor-generator 9, so as to correspond to the torque information. Further, the MTCU 7 receives an SOC of the battery 2, which is transmitted from the MCU 20 through the communication unit 60 of the BMS 1, to control the SOC of the battery 2 to conform with a reference value (e.g., 55%). For example, if the SOC transmitted from the MCU 20 is less than 55%, the MTCU 7 controls the switch of the inverter 8 to charge the battery 2, such that electricity is input to the battery 2. In this case, the battery current has a negative value. Further, if the SOC is more than 55%, the MTCU 7 controls the switch of the inverter 8 to discharge the battery 2, such that electricity is output to the motor-generator 9, and the battery current has a positive value.

The inverter 8 allows the battery 2 to be charged or discharged on the basis of a control signal of the MTCU 7.

The motor-generator 9 drives the vehicle using the electrical energy from the battery 2, on the basis of the torque information transmitted from the MTCU 7. As a result, the MTCU 7 charges and discharges the battery on the basis of the SOC, to prevent the battery 2 from being over-charged or over discharged. Therefore, the battery can be efficiently used for a long time. However, after the battery 2 is mounted in the vehicle, it can be difficult to measure the actual SOC of the battery 2. Therefore, the BMS 1 precisely estimates the SOC using a battery voltage and the cell temperature, sensed by the sensing unit 10, to transmit to the MTCU 7.

Hereinafter, referring to FIG. 2, various aspects of a method of calculating a pack output according an embodiment of the present invention will be described.

Figure 2:
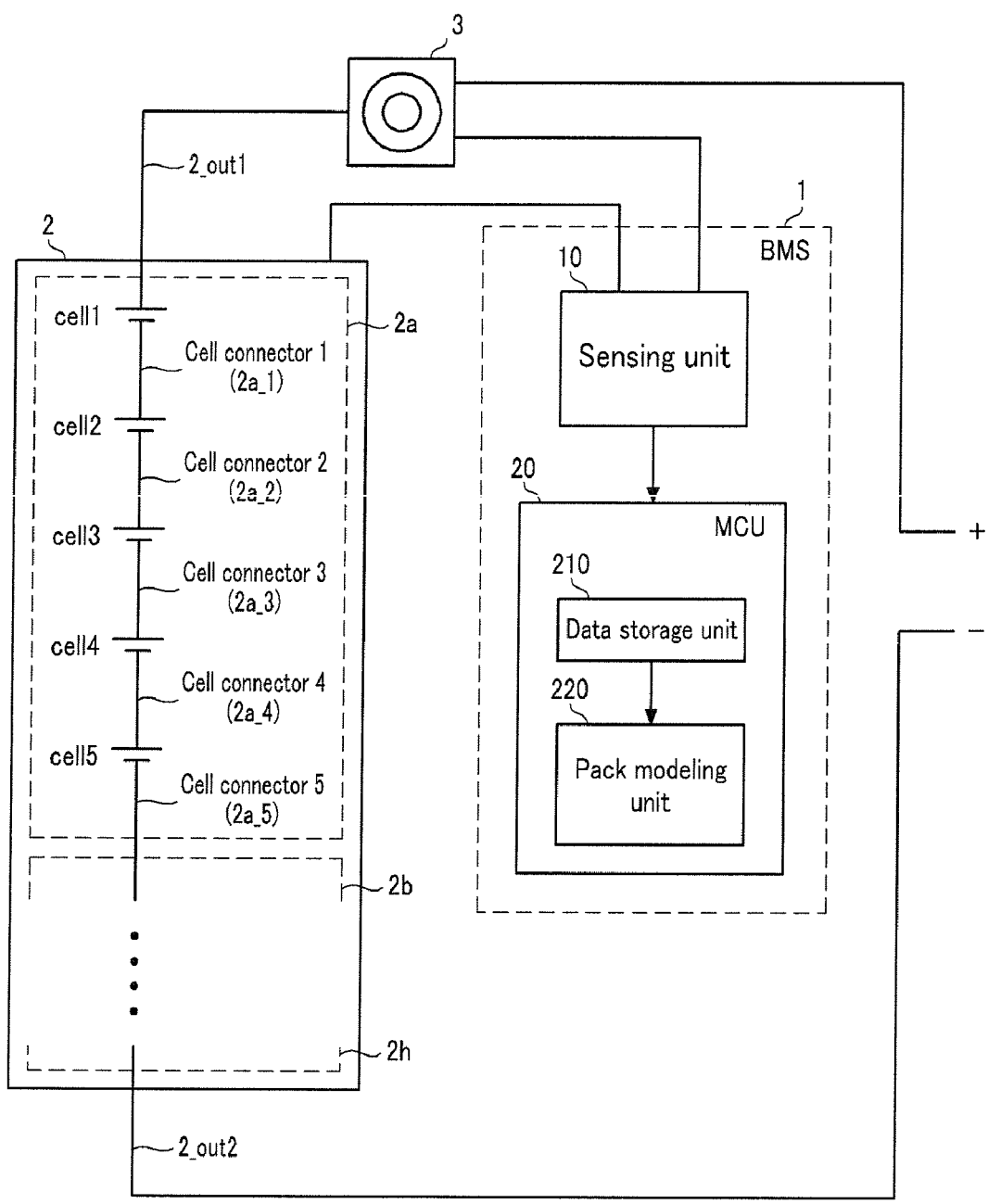
FIG. 2 is a schematic view illustrating the battery 2 and the BMS 1, according to an embodiment of the present invention.

As shown in FIG. 2, the battery 2 includes packs 2a to 2h, in which a plurality of battery cells are coupled to each other in series, a first output terminal 2_out1, a second output terminal 2_out2, and a cell connectors 2a_1 to 2h_5. According to various embodiments the pack output is specifically described referring to the pack 2a. The output of packs 2b to 2h is also used to calculate the pack output using the same method. In this case, the MCU 20 includes a data storage unit 210 and a pack modeling unit 220.

The data storage unit 210 stores information concerning the cells cell1 to cell5 when configuring the battery and the peripheral constituent elements. Specifically, the data storage unit 210 stores information relating to the cells cell1 to cell5, as experimentally determined under various conditions. For example, the data storage unit 210 stores information concerning the voltage and the current of the cells when the battery is charged and discharged, depending on the temperature, and information of the internal resistance of the cells corresponding to the temperature and the SOC. Further, the data storage unit 210 stores a pack assembly resistance value required to calculate an estimated cell resistance. The pack assembly resistance according to various aspects of the embodiment, refers to a resistance generated when assembling the cells in a pack unit, and includes a resistance of the first output terminal 2_out1, the second output terminal 2_out2, and the cell connectors 2a_1 to 2a_5. Further, the pack assembly resistance may include a resistance generated from components such as a switch and a relay that are comprised by the battery.

In various embodiments, the first output terminal 2_out1 and the second output terminal 2_out2, of the pack, comprise a power cable (load line) that extends from the battery. The cell connectors 2a_1-2a_5 refer to connectors that are connected when the cells cell1 to cell5 that are connected in series to each other. The data storage unit 210 stores a cell voltage deviation Vcell_var that is used to calculate the estimated cell voltage. The cell voltage deviation Vcell_var, according to various embodiments, refers to a voltage that removes the unbalance of the voltage difference between the cells, depending on the temperature and the position of the cells, and maintains a predetermined voltage difference with respect to the average voltage of the cells. The data storage unit 210 stores a pack voltage sensing error Vacc, that can be used to calculate the estimated cell voltage. The pack voltage sensing error Vacc is a voltage that can be obtained by dividing the error generated at the time of sensing the pack voltage, by the number of cells configuring the pack, and is used to convert the pack output. The pack voltage sensing error Vacc comprises values that relate to an erroneous operation of the charging and discharging cut-off of the pack voltage.

Hereinafter, methods of calculating a pack output of the battery that is performed in the pack modeling unit 220, are described. The pack modeling unit 220, according to various embodiments, calculates the charging pack output and the discharging pack output.

According to various embodiments, the pack modeling unit 220 receives a cell voltage Vcell from the sensing unit 10. The pack modeling unit 220 calculates the estimated cell voltage by using the pack voltage sensing error Vacc, the cell voltage deviation Vcell_var, and the cell voltage Vcell.

When calculating the charging pack output, the pack modeling unit 220 calculates a first estimated cell voltage by adding a pack voltage sensing error Vacc, the cell voltage deviation Vcell_var, and the cell voltage Vcell, which are determined while charging the battery to the cell voltage Vcell to calculate a first estimated cell voltage. Further, the pack modeling unit 220 detects an internal resistance of the cell that can be stored in the data storage unit 210. Then, the pack modeling unit 220 calculates the estimated cell resistance Rcell by adding the pack assembly resistance to the detected internal resistance of the cell.

The pack modeling unit 220 calculates a voltage difference between a fully charged cell voltage (4.2 V in this example) and the first estimated cell voltage, and divides the voltage difference by the estimated cell resistance Rcell, to calculate the charging cell current. The pack modeling unit 220 multiplies the charging cell current by the fully charged cell voltage (4.2V), to calculate the charging cell output. The charging cell output is then multiplied by 1000, 4.2, and the number of cells in the battery pack. Thus, the pack modeling unit 220 multiplies the charging cell output by the number of cells configuring the pack, to calculate the charging pack output by using the following equation 1:

$$P_c = \left[ \frac{4.2 - (V_{cell} + V_{acc} + V_{cell\_var})}{R_{cell}} \times 1000 \times 4.2 \right] \times \text{the number of cells} \quad \text{(Equation 1)}$$

In Equation 1, Vcell is a cell voltage, Vacc is a pack voltage sensing error, Vcell_var is a cell voltage deviation, and Rcell is an estimated cell resistance. The method of calculating the discharged pack output, according to various embodiments, can be generally the same as the method of calculating the charging pack output, and only the different parts will be described below.

According to some embodiments, when calculating the discharging pack output the pack modeling unit 220 calculates a second estimated cell voltage as the difference between the cell voltage Vcell, and the pack voltage sensing error Vacc, and the cell voltage deviation Vcell_var, which are produced while discharging the battery, to set a second estimated cell voltage. The pack modeling unit 220 detects the internal resistance of the cell as stored in the data storage unit 210. Then, the pack modeling unit 220 adds the pack assembly resistance to the detected internal resistance of the cell, to calculate the estimated cell resistance Rcell. In this case, the pack modeling unit 220 calculates a voltage difference between the second estimated cell voltage and the fully discharged cell voltage (2.8 V), and divides the voltage difference by the estimated cell resistance Rcell, to calculate the discharging cell current. Further, the pack modeling unit 220 multiplies the charged cell current by the fully discharged voltage (2.8 V), to calculate the discharging cell output. Thus, the pack modeling unit 220 multiplies the discharging cell output by the number of cells configuring the pack, to calculate the discharging pack output by using the following equation 2:

$$P_d = \left[ \frac{(V_{cell} - V_{acc} - V_{cell\_var}) - 2.8}{R_{cell}} \times 1000 \times 2.8 \right] \times \text{the number of cells} \quad \text{(Equation 2)}$$

In Equation 2, Vcell is a cell voltage, Vacc is a pack voltage sensing error, Vcell_var is a cell voltage deviation, and Rcell is an estimated cell resistance. The unit of the internal resistance of the battery, according to aspects of various embodiments of the present invention, is set to mΩ, by considering that the amount of the voltage variation is significantly smaller than the amount of the current, but the present invention is not limited thereto. The unit of the resistance may be changed depending on the amount of the variation of the voltage and the current used in Equation.

As described above, according to aspects of the present invention, a pack output calculated by considering various errors generated when configuring the pack and the cell information of the battery, is more accurate than a pack output calculated by simply multiplying the cell voltage by the number of cells configuring the pack, as is taught in the related art. Therefore, it is possible to reduce the time required to upgrade the design of the BMS and the cells.

According to various aspects of the battery management system and method, it is possible to more accurately calculate the pack output in consideration of the error produced when the pack is configured.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A battery management system that manages a battery comprising at least one pack comprising a plurality of cells, the system comprising:
   a sensing unit to measure a voltage, a current, and a temperature of each of the cells; and
   a micro controller unit (MCU) to receive the voltage, the current, and the temperature of each cell, to calculate an estimated cell voltage, by applying a pack voltage sensing error and a cell voltage deviation to each cell voltage, to calculate an estimated cell resistance, by adding a pack assembly resistance to an internal resistance of the cell, and to calculate a pack output, by using the estimated cell voltage and the estimated cell resistance,
wherein the pack assembly resistance is a resistance of elements of the pack other than the cells.

2. The battery management system of claim 1, wherein the MCU is to calculate the estimated cell voltage by adding the pack voltage sensing error, a cell voltage deviation, and the cell voltage, and to calculate a charged cell current by using a voltage difference between a fully charged cell voltage and the first estimated cell voltage, and the estimated cell resistance.

3. The battery management system of claim 2, wherein the MCU is to calculate the charged pack output by using the equation:

$$P_c = \left[\frac{4.2 - (V_{cell} + V_{acc} + V_{cell\_var})}{R_{cell}} \times 1000 \times 4.2\right] \times \text{the number of cells}$$

wherein, Vcell is the cell voltage, Vacc is the pack voltage sensing error, Vcell_13 var is the cell voltage deviation, and Rcell is the estimated cell resistance.

4. The battery management system of claim 1, wherein, the MCU is to calculate the difference between the cell voltage, the pack voltage sensing error, and the cell voltage deviation that are produced while discharging the battery, to calculate a second estimated cell voltage, and to calculate the discharging cell current by using a voltage difference between the second estimated cell voltage and the fully charged cell voltage and an estimated cell resistance.

5. The battery management system of claim 4, wherein the MCU is to calculate a discharging pack output of the battery using the equation:

$$P_d = \left[\frac{(V_{cell} - V_{acc} - V_{cell\_var}) - 2.8}{R_{cell}} \times 1000 \times 2.8\right] \times \text{the number of cells}$$

wherein Vcell is the cell voltage, Vacc is the pack voltage sensing error, Vcell_13 var is the cell voltage deviation, and Rcell is the estimated cell resistance.

6. The battery management system of claim 1, wherein the MCU further comprises a data storage unit to store data from the sensing unit.

7. The battery management system of claim 1 wherein the MCU further comprises a pack modeling unit to calculate the pack output.

8. A battery management method for managing a battery comprising at least one pack comprising a plurality of cells, the method comprising:
calculating by using a micro controller unit (MCU) an estimated cell voltage by using a pack voltage sensing error, a cell voltage deviation, and a cell voltage;
calculating an estimated cell resistance by adding a pack assembly resistance to an internal resistance of the cell; and
calculating a pack output by using the estimated cell voltage, the estimated cell resistance, and one of a fully charged cell voltage and fully discharged cell voltage,
wherein the pack assembly resistance is a resistance of elements of the pack other than the cells.

9. The method of claim 8, wherein the calculating of the estimated cell voltage comprises, adding the pack voltage sensing error, the cell voltage deviation, and the cell voltage,
wherein the pack voltage sensing error, the cell voltage, and the cell voltage deviation are detected while the pack is charging.

10. The method of claim 9, wherein the calculating of the battery output comprises, calculating a charging cell current by using a difference between the fully charged cell voltage and the estimated cell voltage, divided by the estimated cell resistance.

11. The method of claim 9, wherein the calculating of the pack output comprises using the following equation:

$$P_c = \left[\frac{4.2 - (V_{cell} + V_{acc} + V_{cell\_var})}{R_{cell}} \times 1000 \times 4.2\right] \times \text{the number of cells}$$

wherein Vcell is the cell voltage, Vacc is the pack voltage sensing error, Vcell_var is the cell voltage deviation, and Rcell is the estimated cell resistance.

12. The method of claim 8, wherein the calculating of an estimated cell voltage comprises calculating the difference between the cell voltage the pack voltage sensing error, and the cell voltage deviation, wherein, the cell voltage, the pack voltage sensing error, and the cell voltage deviation are detected while the pack is discharging.

13. The method of claim 12, wherein the calculating of the pack output comprises calculating the discharging cell current by using a voltage difference between the second estimated cell voltage and the fully discharged cell voltage, divided by an estimated cell resistance.

14. The method of claim 12, wherein the calculating of the pack output comprises calculating the discharging pack output of the battery using the following equation:

$$P_d = \left[\frac{(V_{cell} - V_{acc} - V_{cell\_var}) - 2.8}{R_{cell}} \times 1000 \times 2.8\right] \times \text{the number of cells}$$

wherein, Vcell is the cell voltage, Vacc is the pack voltage sensing error, Vcell_var is the cell voltage deviation, and Rcell is the estimated cell resistance.

15. The method of claim 8, wherein the cell voltage is an average voltage of the plurality of cells.

16. A battery management method, for managing a battery pack comprising a plurality of cells, the method comprising:
calculating by using a micro controller unit (MCU) an estimated cell voltage of the pack;
calculating an estimated cell resistance of the pack; and
calculating a pack output of the pack by using an estimated cell voltage of the plurality of cells, an estimated cell resistance of the plurality of cells, and one oft the fully charged cell voltage of the pack and the fully discharged cell voltage of the pack,
wherein the calculating of the estimated cell voltage comprises detecting the cell voltage, the pack voltage sensing error, and the cell voltage deviation of the pack, while the pack is discharging.

17. The method of claim 16, wherein the calculating an estimated cell voltage comprises, adding a pack assembly resistance of the pack to an internal resistance of the plurality of cells of the pack,
wherein the pack assembly resistance is a resistance of elements of the pack other than the cells.

18. The battery of claim 16, wherein the calculating a pack output comprises, using the following formula:

$$P_c = \left[\frac{4.2 - (V_{cell} + V_{acc} + V_{cell\_var})}{R_{cell}} \times 1000 \times 4.2\right] \times \text{the number of cells}$$

wherein Vcell is the cell voltage, Vacc is the pack voltage sensing error, Vcell_var is the cell voltage deviation, and Rcell is the estimated cell resistance.

19. The method of claim 16, wherein the calculating an estimated cell voltage comprises detecting the cell voltage, the pack voltage sensing error, and the cell voltage deviation, of the pack, while the pack is charging.

20. The method of claim 16, wherein the calculating a pack output comprises using the following formula:

$$P_d = \left[\frac{(V_{cell} - V_{acc} - V_{cell\_var}) - 2.8}{R_{cell}} \times 1000 \times 2.8\right] \times \text{the number of cells}$$

wherein, Vcell is the cell voltage, Vacc is the pack voltage sensing error, Vcell_var is the cell voltage deviation, and Rcell is the estimated cell resistance.

* * * * *

UNITED STATES PATENT AND TRADEMARK OFFICE
CERTIFICATE OF CORRECTION

PATENT NO. : 7,548,821 B2  Page 1 of 1
APPLICATION NO. : 11/771733
DATED : June 16, 2009
INVENTOR(S) : Yong-Jun Tae et al.

It is certified that error appears in the above-identified patent and that said Letters Patent is hereby corrected as shown below:

Column 9, lines 22 and 42, change "$Vcell_{13}var$" to --$Vcell\_var$--.

Column 9, line 47, change "claim 1" to --claim 1,--.

Column 10, line 52, change "oft" to --of--.

Signed and Sealed this

Eighteenth Day of August, 2009

David J. Kappos
*Director of the United States Patent and Trademark Office*